(12) United States Patent
Chen et al.

(10) Patent No.: US 11,740,564 B2
(45) Date of Patent: Aug. 29, 2023

(54) LITHOGRAPHY APPARATUS AND METHOD USING THE SAME

(71) Applicant: TAIWAN SEMICONDUCTOR MANUFACTURING COMPANY, LTD., Hsinchu (TW)

(72) Inventors: Tao-Hsin Chen, Tainan (TW); Chia-Yu Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 82 days.

(21) Appl. No.: 17/165,626

(22) Filed: Feb. 2, 2021

(65) Prior Publication Data

US 2021/0397102 A1 Dec. 23, 2021

Related U.S. Application Data

(60) Provisional application No. 63/040,536, filed on Jun. 18, 2020.

(51) Int. Cl.
*G03F 7/20* (2006.01)
*G03F 7/00* (2006.01)
*H01L 21/687* (2006.01)

(52) U.S. Cl.
CPC ...... *G03F 7/70916* (2013.01); *G03F 7/70033* (2013.01); *G03F 7/7085* (2013.01); *G03F 7/70808* (2013.01); *G03F 7/70866* (2013.01); *G03F 7/70933* (2013.01); *H01L 21/68785* (2013.01)

(58) Field of Classification Search
CPC ............. G03F 7/70916; G03F 7/70808; G03F 7/70033; G03F 7/70691; G03F 7/707; G03F 7/70716; G03F 7/70733; G03F 7/70766; G03F 7/70783; G03F 7/708; G03F 7/70816; G03F 7/70841; G03F 7/70858; G03F 7/70866; G03F 7/70875; G03F 7/70883–70891; G03F 7/70908–70941; H01L 21/68785
USPC ......... 355/30, 52–77, 133; 250/492.1–492.3, 250/493.1, 503.1, 504 r
See application file for complete search history.

(56) References Cited

U.S. PATENT DOCUMENTS

| | | | |
|---|---|---|---|
| 7,253,875 B1 * | 8/2007 | Luttikhuis | G03F 7/70775 355/30 |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |

(Continued)

*Primary Examiner* — Christina A Riddle
(74) *Attorney, Agent, or Firm* — Birch, Stewart, Kolasch & Birch, LLP

(57) ABSTRACT

A method comprises loading a wafer onto a wafer chuck of a lithography apparatus, projecting an extreme ultraviolet light through an opening of a frame structure of the lithography apparatus, onto the wafer, and introducing an airflow from an air curtain module on the wafer chuck toward the frame structure, wherein the air curtain module surrounds the wafer. The airflow forms an air curtain around the wafer, and shields the wafer from contaminants from the frame structure or a wafer stage.

20 Claims, 11 Drawing Sheets

(56) References Cited

U.S. PATENT DOCUMENTS

| | | | |
|---|---|---|---|
| 9,529,268 B2 | 12/2016 | Chang et al. | |
| 9,548,303 B2 | 1/2017 | Lee et al. | |
| 2001/0005595 A1* | 6/2001 | Morita | G03F 7/707 |
| | | | 438/22 |
| 2002/0009813 A1* | 1/2002 | Deguchi | G03F 7/70933 |
| | | | 438/5 |
| 2005/0286032 A1* | 12/2005 | Lof | G03F 7/70808 |
| | | | 355/53 |
| 2006/0162739 A1* | 7/2006 | Sogard | B08B 7/0014 |
| | | | 134/1 |
| 2007/0046911 A1* | 3/2007 | Aichi | G03F 7/70716 |
| | | | 355/53 |
| 2011/0199601 A1* | 8/2011 | Kaneko | G03F 7/70341 |
| | | | 355/72 |
| 2012/0086925 A1* | 4/2012 | Kraus | G03F 7/70916 |
| | | | 355/30 |
| 2015/0109598 A1* | 4/2015 | Vergeer | G03F 9/7088 |
| | | | 355/72 |
| 2016/0023356 A1* | 1/2016 | Hara | G03F 7/7075 |
| | | | 355/72 |
| 2016/0349631 A1* | 12/2016 | Nakiboglu | G03F 7/70908 |
| 2017/0261864 A1* | 9/2017 | Nakiboglu | G03F 7/70808 |
| 2018/0113389 A1* | 4/2018 | Kroes | G03F 7/70716 |
| 2019/0094719 A1* | 3/2019 | Cheng | H01L 21/67017 |

* cited by examiner

LITHOGRAPHY APPARATUS AND METHOD USING THE SAME

PRIORITY CLAIM AND CROSS-REFERENCE

This application claims priority to U.S. Provisional Application Ser. No. 63/040,536, filed Jun. 18, 2020, which is herein incorporated by reference in its entirety.

BACKGROUND

Lithography apparatuses are used to pattern images onto a wafer. The wafer is placed on a wafer chuck, and images are projected onto the wafer with high precision. To maintain high precision of the patterning, the environment is kept clean of contaminants, including debris from a frame structure, wafer stage, and other parts of the lithography apparatus.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
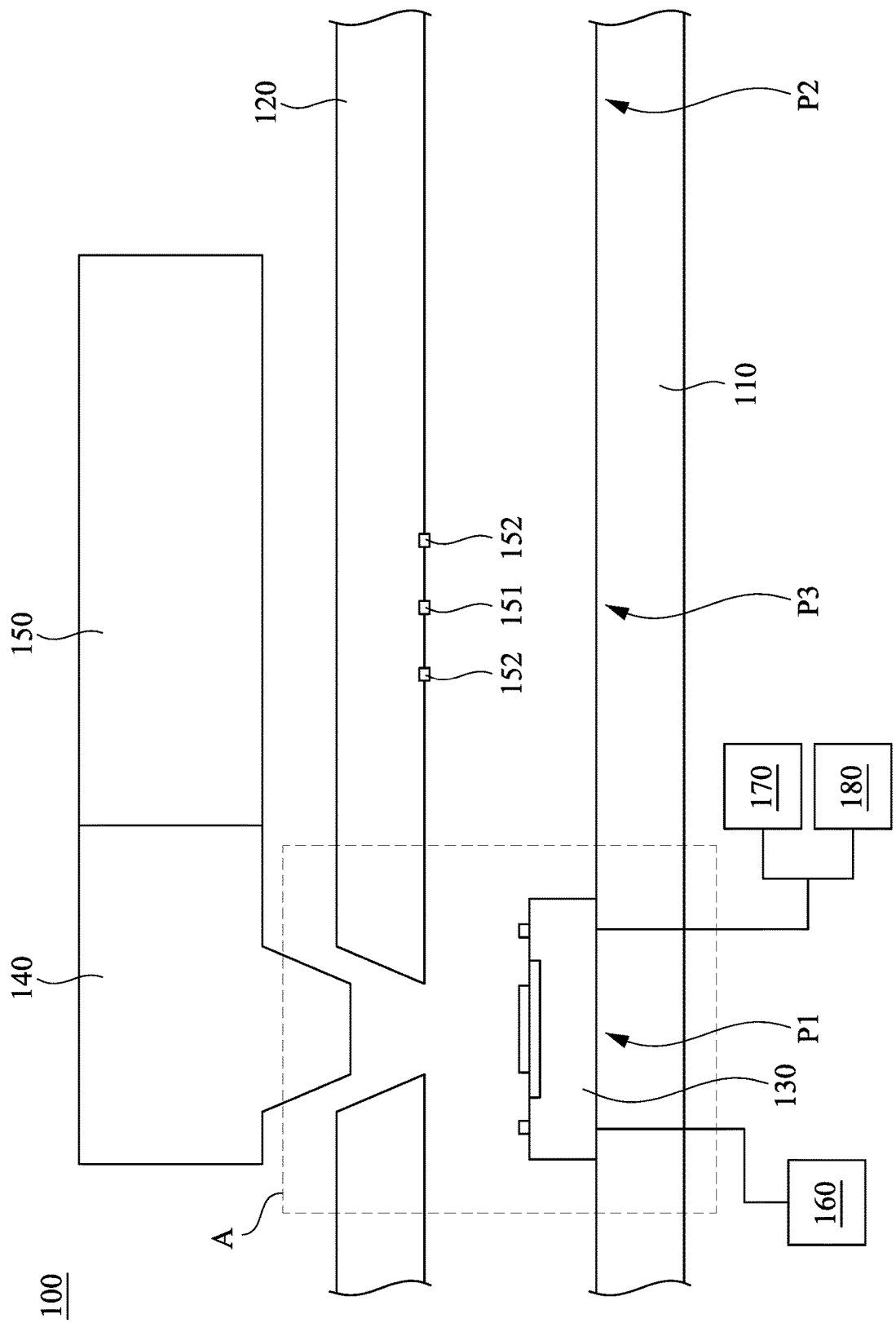
FIG. 1A shows a lithography apparatus according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is related to a lithography apparatus and a method of using the same. In particular, the present disclosure is related to a lithography apparatus including a wafer chuck having an air curtain module for introducing an airflow, a method for cleaning the lithography apparatus by using the airflow, and a method for shielding a wafer on the wafer chuck during lithography by using the airflow.

Figure 1B:
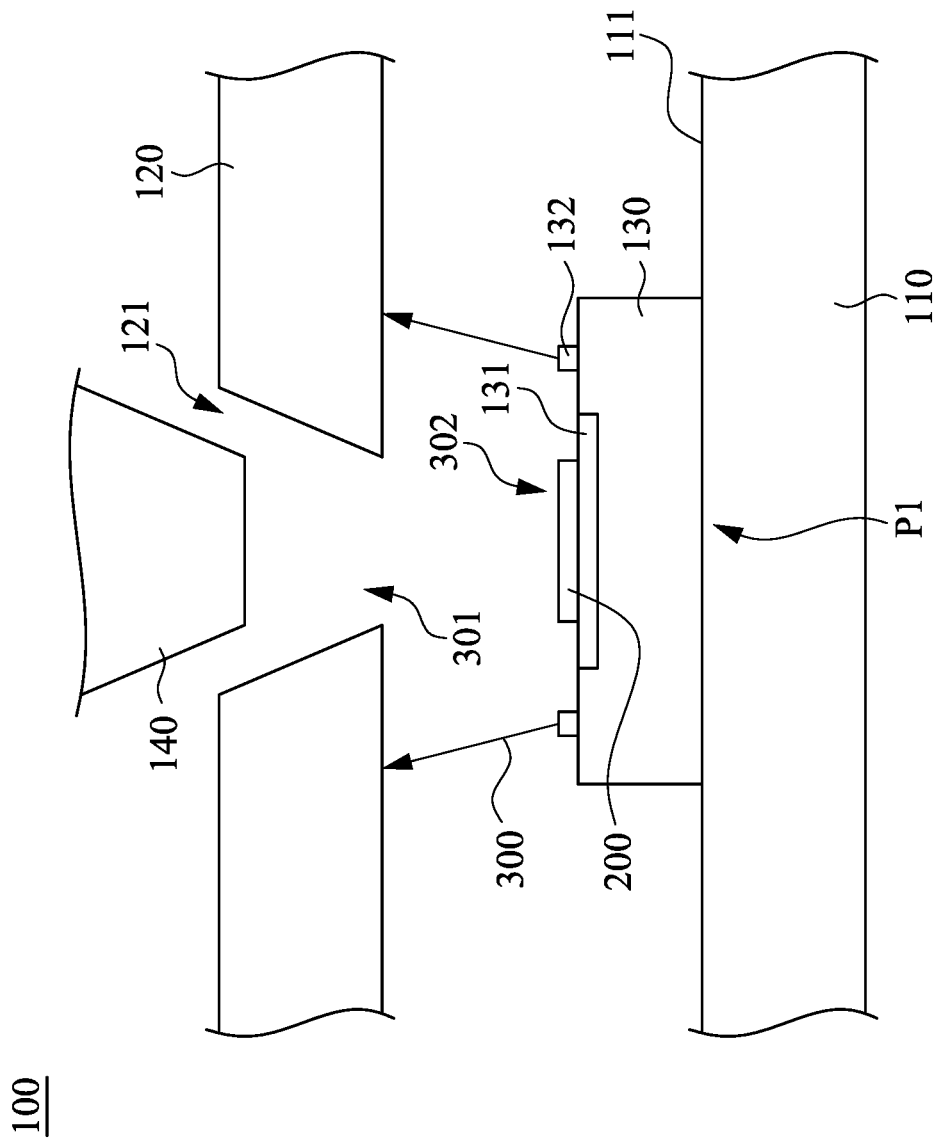
FIG. 1B shows an enlarged view of area A in FIG. 1A according to some embodiments of the present disclosure.

FIG. 1A shows a lithography apparatus 100 according to some embodiments of the present disclosure, and FIG. 1B is an enlarged view of area A in FIG. 1A. The lithography apparatus 100 includes a wafer stage 110, a frame structure 120, and a wafer chuck 130, a projection optical system 140, and a light source 150. The light source 150 is configured to provide a light beam to the projection optical system 140. In some embodiments, the light source provides an extreme ultraviolet light beam to the projection optical system 140. The frame structure 120 surrounds a portion of a projection optical system 140.

The wafer stage 110 has a top face 111. The wafer chuck 130 is movably coupled to the wafer stage 110, and rests on top of the top face 111 of the wafer stage 110. In some embodiments, the wafer chuck 130 is movably coupled to the wafer stage 110 through magnets respectively arranged in the wafer chuck 130 and the wafer stage 110.

Furthermore, in some embodiments of the present disclosure, the magnet in the wafer chuck 130 and the magnet in the wafer stage 110 are each an electromagnet. The magnetic field of each electromagnet can be adjusted by an electric current, through an electric wire connected to the corresponding electromagnet. By controlling the electric field of the electromagnet in the wafer chuck 130, and/or the electric field of the electromagnet in the wafer stage 110, the wafer chuck 130 can be controlled to move on the top face 111 of the wafer stage 110 in a horizontal direction. In some embodiments, an electromagnet controller 160 is configured to control the electric field of the electromagnet of the wafer chuck 130, and/or the electric field of the electromagnet of the wafer stage 110.

Alternately, in some embodiments of the present disclosure, the magnet in the wafer chuck 130 is an electromagnet, and the magnet in the wafer stage 110 is a permanent magnet. The magnetic field of the electromagnet of the wafer chuck 130 can be adjusted by an electric current, through an electric wire connected thereto. By controlling the electric field of the electromagnet in the wafer chuck 130, the wafer chuck 130 can be controlled to move on the top face 111 of the wafer stage 110 in a horizontal direction.

The frame structure 120 is arranged above the wafer stage 110, and is formed with an opening 121. The opening 121 is configured to accommodate the projection optical system 140, or a portion thereof. The projection optical system 140 is configured to project an image onto a surface thereunder, during lithography. Specifically, when a wafer 200 is positioned under the opening 121 of the frame structure 120 at a first position P1 and faces the frame structure 120, the image projected by the projection optical system 140 can strike the wafer, and the image projected by the projection optical system 140 can be accurately patterned onto a photoresist layer on the wafer.

The wafer chuck 130 includes a wafer table 131 and an air curtain module 132. The wafer table 131 is configured to accommodate the wafer 200, and faces upward. The wafer chuck 130 and the wafer 200 arranged on the wafer table 131 of said wafer chuck 130 can be moved to the first position P1, such that the wafer 200 accommodated on the wafer chuck 130 is positioned under and faces the projection optical system 140, and an image projected by the projection optical system 140 can strike the wafer 200 during a lithography process. Furthermore, as shown in FIG. 1A, the wafer chuck 130 can be moved away from the first position P1 to a second position P2 away from the opening 121 of the frame structure 120, for receiving the wafer 200 onto the wafer table 131 before the lithography process, or unloading the wafer 200 from the wafer table 131 after the lithography process.

Figure 2:
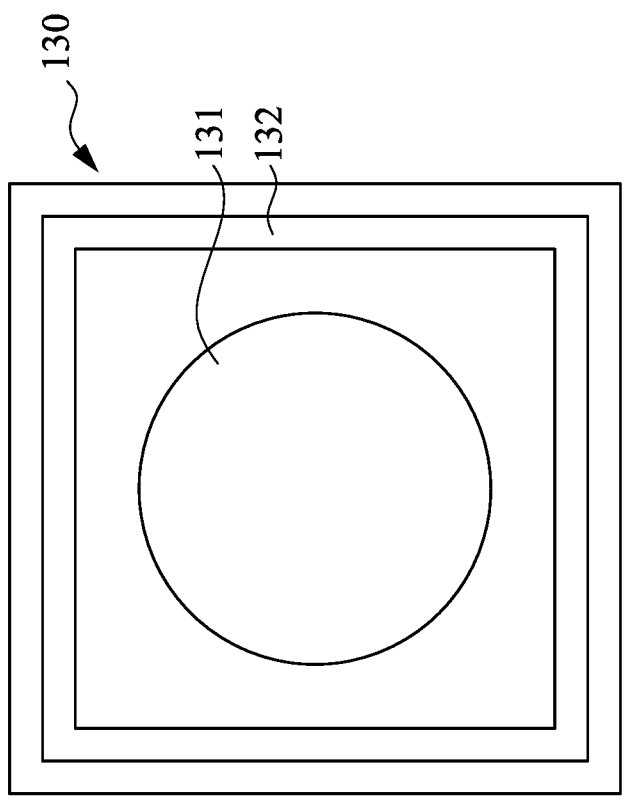
FIG. 2 shows a top view of the wafer chuck according to some embodiments of the present disclosure.

FIG. 2 shows a top view of the wafer chuck 130 according to some embodiments of the present disclosure. The air curtain module 132 of the wafer chuck 130 surrounds the wafer table 131, and is configured to introduce an airflow in an upward direction toward the frame structure 120. The air curtain module 132 has a plurality of sides, e.g., four sides as shown in FIG. 2, and a distance between any two opposite sides is greater than a width of the opening 121. In some embodiments, the airflow introduced by the air curtain module 132 forms an air curtain 300 around the wafer chuck 130. Referring again to FIG. 1B, the air curtain has a top opening 301 and a bottom opening 302, and when the wafer chuck 130 is at the first position P1 under the opening 121 of the frame structure 120, the opening 121 of the frame structure 120 is substantially within the top opening 301 of the air curtain 300. A projection of the opening 121 of the frame structure chuck onto the wafer chuck 130 is surrounded by the air curtain module 132. Thus, when the wafer table 131 is positioned at the first position P1 under the opening 121 of the frame structure 120 at the first position P1, the air curtain 300 introduced by the air curtain module 132 can surround the wafer 200 arranged on the wafer table 131, and shield the wafer 200 from contaminants from the wafer stage 110 and the frame structure 120. The contaminants can be, for example, copper debris separated from the frame structure 120 or the wafer stage 110. Without the air curtain 300, the copper debris and other contaminants can fall onto the wafer 200 accommodated on the wafer table 131 of the wafer chuck 130, and compromise the entire wafer 200 or a portion thereof.

Figure 3:
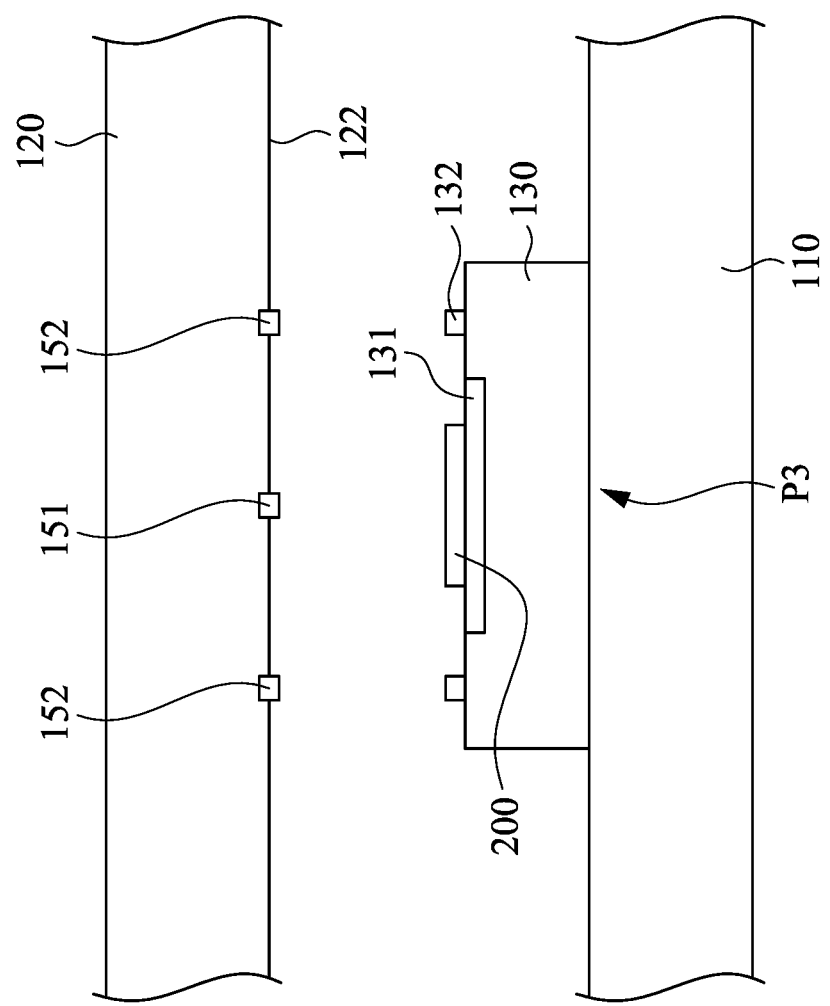
FIG. 3 shows a lithography apparatus according to some embodiments of the present disclosure.

FIG. 3 shows a lithography apparatus 100 according to some embodiments of the present disclosure. The frame structure 120 includes an alignment sensor 151 and a level sensor 152 arranged on a bottom surface 122 of the frame structure 120. The alignment sensor 151 detects the orientation of the surface of the wafer table 131. In some embodiments, the level sensor 152 is a distance sensor, or an infrared distance sensor. For example, the level sensor 152 can determine if the wafer table 131 is substantially parallel to a predetermined horizontal plane, such that an image projected by the projection optical system 140 can be accurately patterned onto the wafer accommodated on the wafer table 131. The alignment sensor 151 detects a horizontal position of the wafer chuck, such that the wafer chuck 130 can be accurately aligned at a third position P3 (see FIG. 1A) on the wafer stage 110. From the third position P3, the wafer chuck 130 can then be moved accurately to the first position P1 under the opening 121 of the frame structure 120 by predetermining the relative distance between the third position P3 and the first position P1. In some embodiments, the alignment sensor 151 is an optical sensor.

Figure 4A:
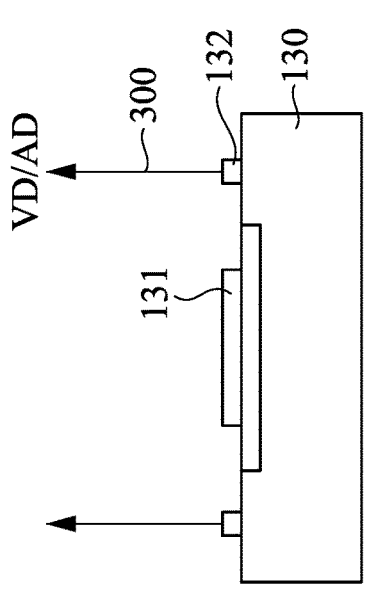
FIG. 4A shows a wafer chuck having an air curtain module according to some embodiments of the present disclosure.

FIG. 4A shows a cross-sectional view of a wafer chuck 130 having an air curtain module 132 according to some embodiments of the present disclosure. The airflow is introduced by the air curtain module 132 in an airflow direction, and an angle included between the airflow direction AD and a vertical direction VD is constant. In other words, the direction of the airflow direction is constant. The angle included between the airflow direction and the vertical direction is from about zero degrees to about forty five degrees. The airflow direction is directed upward, and relative to the vertical direction is directed outward away from the wafer table 131. By flowing away from the wafer table 131, the airflow pushes contaminants particles away from the wafer 200 accommodated on the wafer table 131.

Figure 4B:
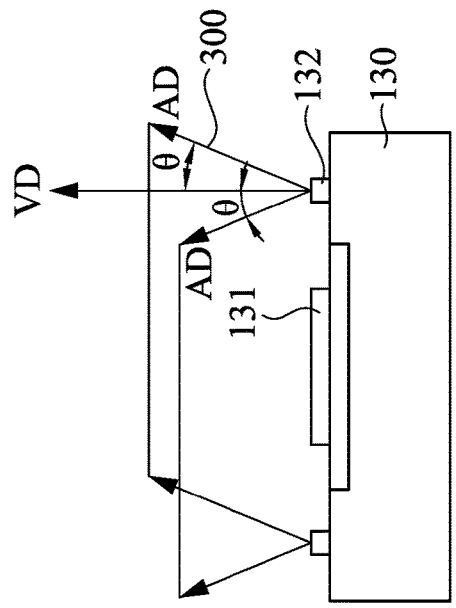
FIG. 4B shows a wafer chuck having an air curtain module according to some embodiments of the present disclosure.

FIG. 4B shows a cross-sectional view of a wafer chuck 130 having an air curtain module 132 according to some embodiments of the present disclosure. The angle included between the airflow direction AD and the vertical direction VD is less than about 5 degrees, e.g., about zero degrees. In other words, the airflow direction AD is directed upward, and substantially parallel to the vertical direction VD.

Figure 4C:
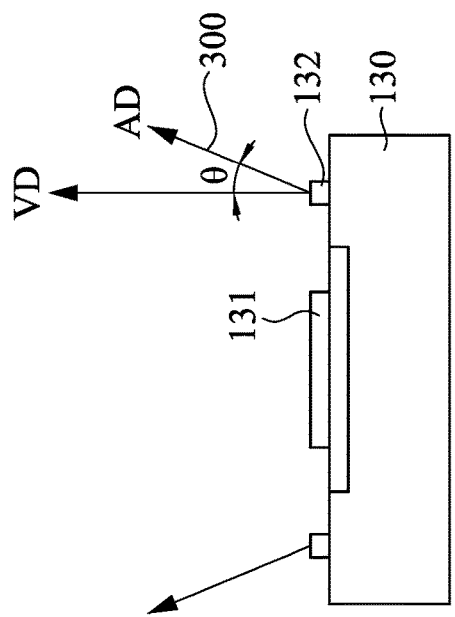
FIG. 4C shows a wafer chuck having an air curtain module according to some embodiments of the present disclosure.

FIG. 4C shows a cross-sectional view of a wafer chuck 130 having an air curtain module 132 according to some embodiments of the present disclosure. The angle included between the airflow direction AD and the vertical direction VD is from about zero degrees to about forty five degrees. The airflow direction AD is directed upward, and relative to the vertical direction VD is directed inward toward the wafer table 131.

Figure 4D:
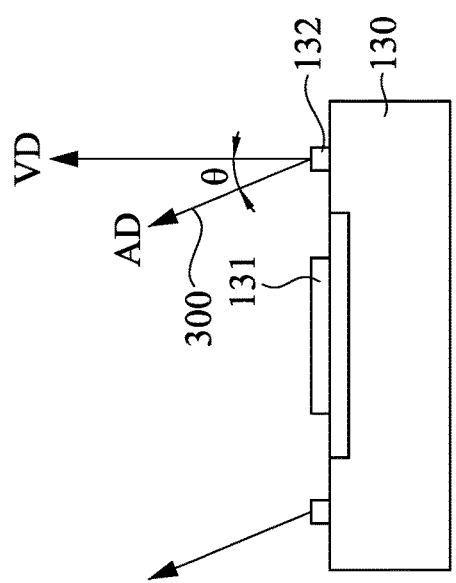
FIG. 4D shows a wafer chuck having an air curtain module according to some embodiments of the present disclosure.

FIG. 4D shows a cross-sectional view of a wafer chuck 130 having an air curtain module 132 according to some embodiments of the present disclosure. The airflow is introduced by the air curtain module 132 in an airflow direction AD, and an angle included between the airflow direction AD and a vertical direction VD is varying. In other words, the direction of the airflow direction AD is varying. Specifically, the angle included between the airflow direction AD and the vertical direction VD varies relative to the vertical direction VD within about forty five degrees, and the airflow direction AD varies between being directed away from the wafer table 131, and being directed toward the wafer table 131.

Figure 5:
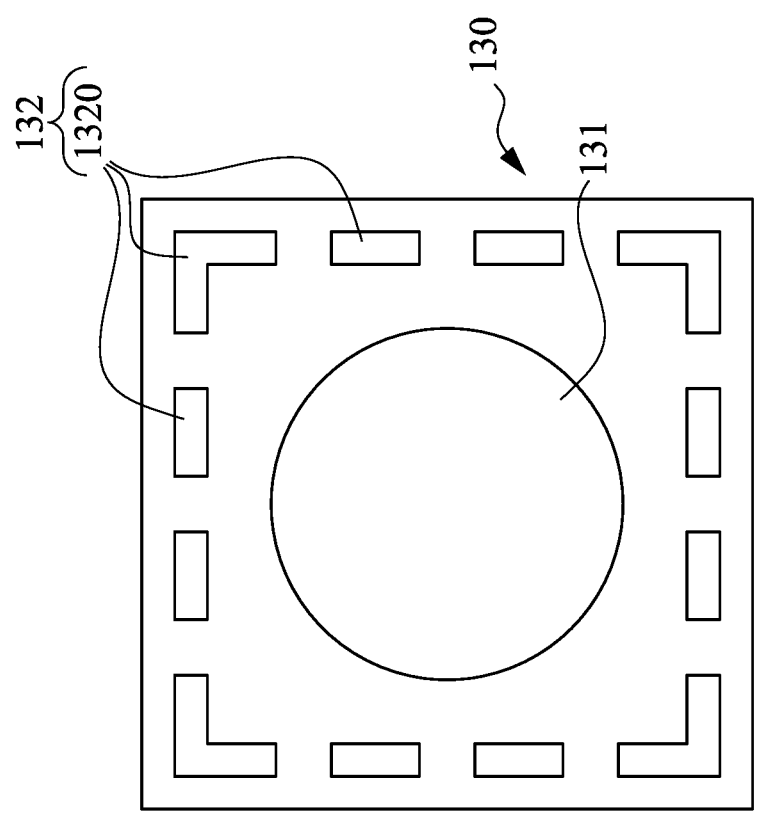
FIG. 5 shows a top view of the wafer chuck according to some embodiments of the present disclosure.

FIG. 5 shows a top view of wafer chuck 130 according to some embodiments of the present disclosure. The air curtain module 132 includes a plurality of segments 1320 separate from each other. Each of the segments 1320 can introduce an air curtain 300 in the same airflow direction, or in different airflow directions. An included angled between the vertical direction and the airflow directions of each of the airflows introduced by the segments 1320 of the air curtain module 132 can be a constant angle between about zero degrees to about forty five degrees, a constant angle of about zero degrees, or a varying angle varying within about forty five degrees.

Figure 6:
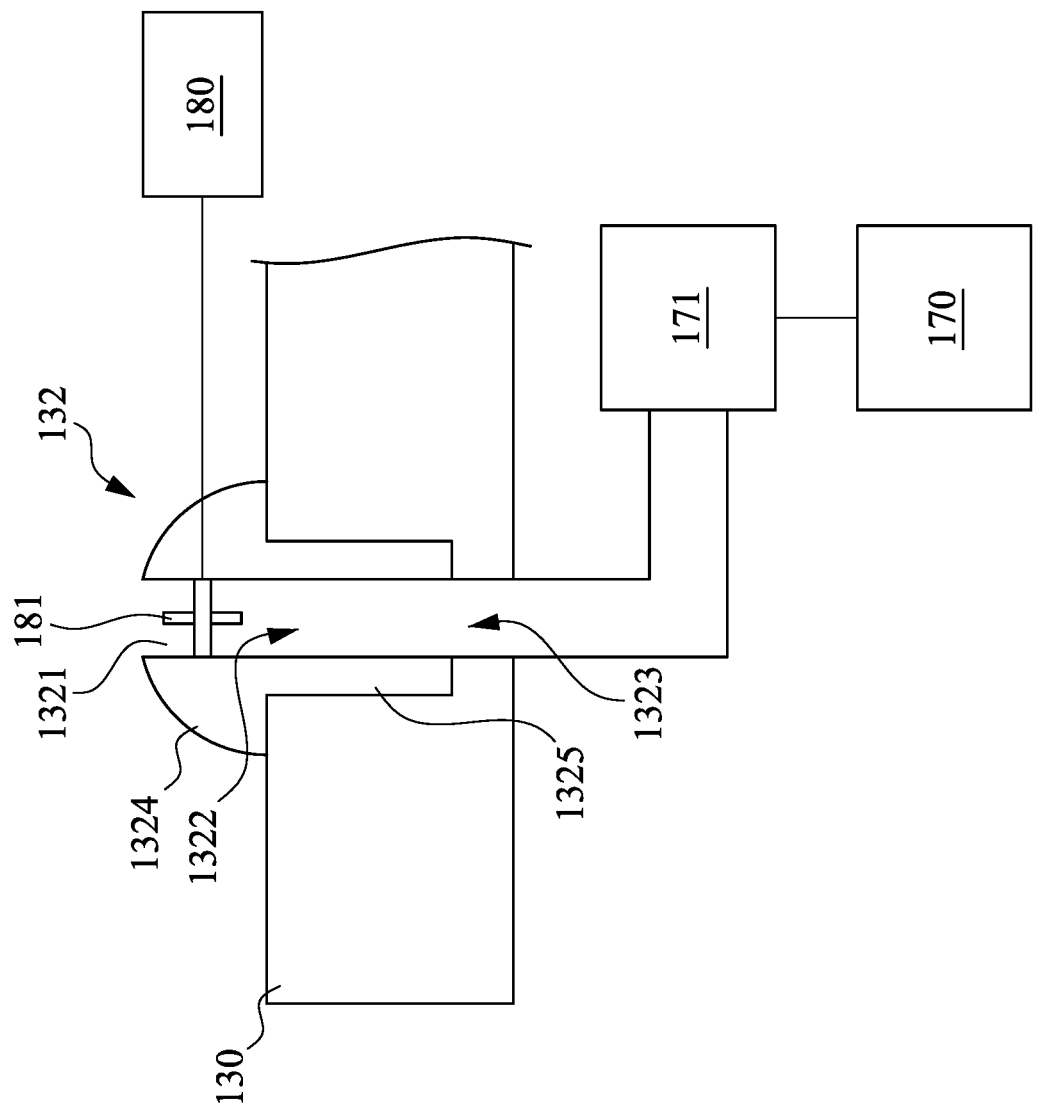
FIG. 6 shows a cross-sectional view of the air curtain module 132 according to some embodiments of the present disclosure.

FIG. 6 shows a cross-sectional view of the air curtain module 132 according to some embodiments of the present disclosure. The air curtain module 132 has an airflow opening 1321, facing upward and toward the frame structure 120 (see FIG. 1B). The air curtain module 132 further has an airflow passage 1322 and an inlet 1323. An airflow pressure controller 170 is configured to control a flow of gas from a gas source 171 into the air curtain module 132, through the inlet 1323. Specifically, the airflow pressure controller 170 can control the pressure of the gas flowing into the air curtain module 132. The inlet 1323 is configured to allow clean dry air, hydrogen gas, nitrogen gas, or the like controlled by the gas controller 170 to flow into the airflow passage 1322, from where the pressure forces the clean dry air, hydrogen gas, nitrogen gas, or the like to flow out of the airflow opening 1321. An airflow direction controller 180 controls a direction panel 181, specifically the orientation of the direction panel 18. The direction panel 181 is arranged at the airflow opening 1321, such that the orientation of the direction panel 181 controls the direction of the airflow flowing out of the airflow opening 1321.

The air curtain module 132 further has an extension portion 1324 and an embedded portion 1325. The extension portion 1324 sits on top of the wafer chuck 130, and the embedded portion 1325 extends into the wafer chuck 130 so as to fix the air curtain module 132 to the wafer chuck 130. The airflow opening 1321 and the airflow passage 1322 can run through the entire air curtain module, to create an airflow that forms an air curtain 300 surrounding the wafer table 131. The inlet 1323 can be formed at certain sections of the air curtain module 132, such that the entire air curtain module 132 is integrally formed as one body.

Figure 7A:
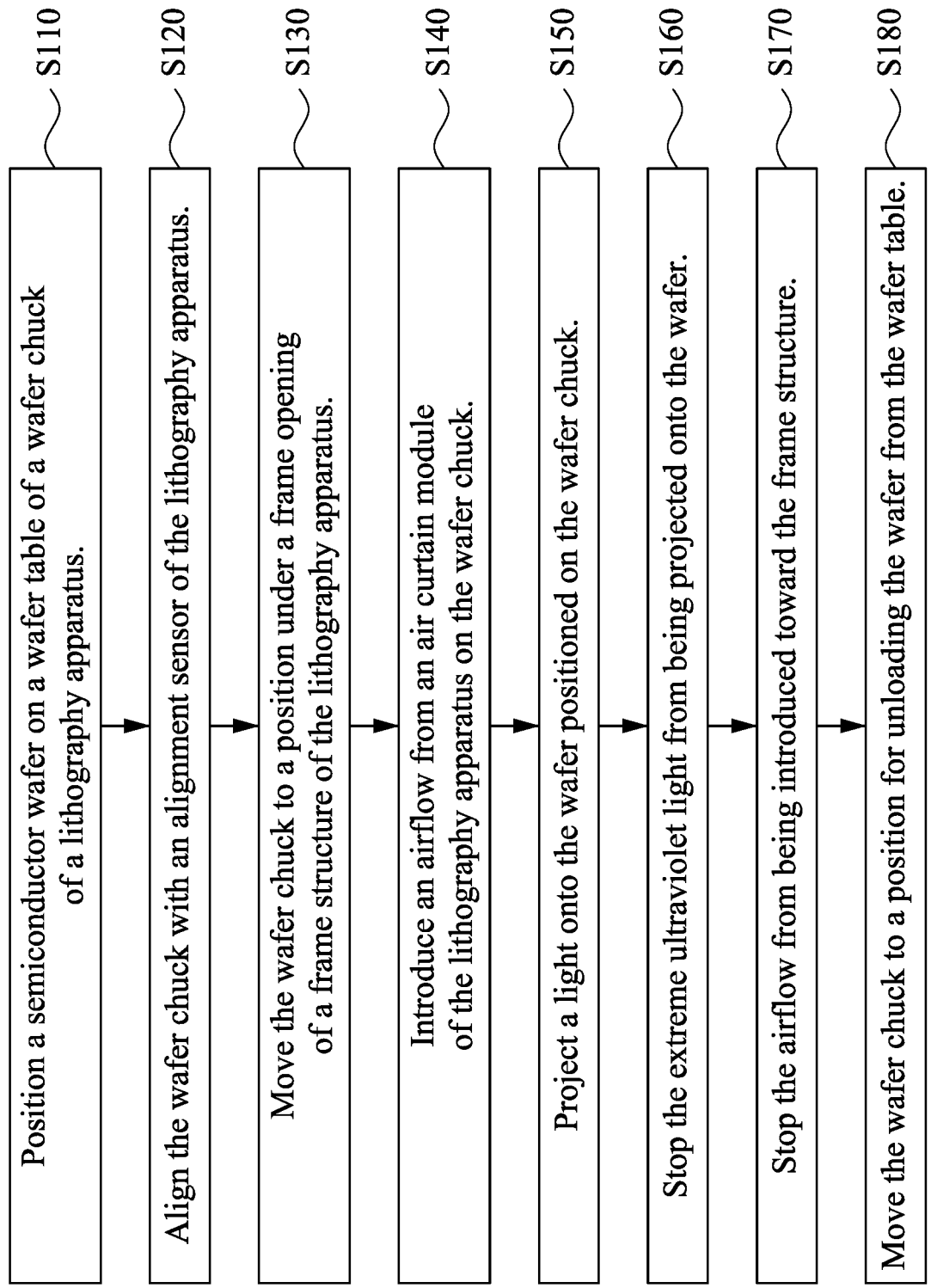
FIG. 7A shows a flowchart of a method for patterning a photoresist layer on a wafer by using a wafer lithography apparatus, according to some embodiments of the present disclosure.

FIG. 7A shows a flowchart of a method for patterning a photoresist layer on a wafer by using a lithography apparatus, according to some embodiments of the present disclosure. The method is merely an example, and is not intended to limit the present disclosure beyond what is explicitly recited in the claims. Additional operations can be provided before, during, and after the method, and some operations described can be replaced, eliminated, or moved around for additional embodiments of the process.

In operation S110, a semiconductor wafer is positioned on a wafer table of a wafer chuck of a lithography apparatus. For example, as shown in FIG. 1A, the wafer chuck 130 is movably coupled to the wafer stage 110, and receives the wafer at the second position P2. The wafer chuck 130 is moved on the top face 111 of the wafer stage 110 by adjusting the magnetic field of the electromagnet in the wafer chuck 130.

In some embodiments of the present disclosure, the wafer chuck 130 is moved on the top face 111 of the wafer stage 110 by adjusting the magnetic field of the electromagnet in the wafer stage 110.

Specifically, in some embodiments of the present disclosure, the magnet in the wafer chuck 130 and a magnet in the wafer stage 110 are each an electromagnet. The magnetic field of each electromagnet can be adjusted by an electric current, through an electric wire connected to the corresponding electromagnet. An electromagnet controller 160 is configured to control the electric field of the electromagnet of the wafer chuck 130, and/or the electric field of the electromagnet of the wafer stage 110. By controlling the electric field of the electromagnet in the wafer chuck 130, and/or the electric field of the electromagnet in the wafer stage 110, the wafer chuck 130 can be controlled to move on the top face 111 of the wafer stage 110 in a horizontal direction.

Alternately, in some embodiments of the present disclosure, the magnet in the wafer chuck 130 is an electromagnet, and the magnet in the wafer stage 110 is a permanent magnet. The magnetic field of the electromagnet of the wafer chuck 130 can be adjusted by an electric current, through an electric wire connected thereto. By controlling the electric field of the electromagnet in the wafer chuck 130, the wafer chuck 130 can be controlled to move on the top face 111 of the wafer stage 110 in a horizontal direction.

In operation S120, the wafer chuck is aligned with an alignment sensor of the lithography apparatus. Specifically, as shown in FIG. 1A, the wafer chuck 130 is moved under the alignment sensor 151, and moved horizontally until the alignment sensor 151 determines that the wafer chuck 130 is at the third position P3, which is a predetermined distance away from the first position P1 under the opening 121 of the frame structure 120.

In operation S130, the wafer chuck is moved to a position under an opening of a frame structure of the lithography apparatus. Specifically, as shown in FIG. 1A, the wafer chuck 130 is moved to the first position P1 under the opening 121 of the frame structure 120. Similarly, the wafer chuck 130 is moved by adjusting the magnetic field of the electromagnet in the wafer stage 110, or the electromagnet in the wafer stage 110.

In operation S140, an airflow is introduced from an air curtain module of the lithography apparatus on the wafer chuck. For example, as shown in FIG. 1A, the airflow is directed from the air curtain module 132 toward the frame structure 120, and the air curtain module 132 surrounds the wafer 200. The airflow introduced from the air curtain module 132 of the wafer chuck 130 forms an air curtain 300. The air curtain module 132 of the wafer chuck 130 surrounds the wafer table 131, and the airflow flows in an upward direction toward the frame structure 120. In some embodiments of the present disclosure, the air curtain module 132 has four sides, and a distance between any two opposite sides is greater than a width of the opening 121, such that the airflow introduced by the air curtain module 132 impacts the frame structure 120 instead of flowing into the opening 121 of the frame structure 120. The air curtain 300 has a top opening 301 and a bottom opening 302, and the opening 121 of the frame structure 120 is substantially coplanar to and substantially within the top opening 301 of the air curtain 300. In other words, a projection of the opening 121 of the frame structure 120 onto the wafer chuck 130 is surrounded by the air curtain module 132 of the wafer chuck 130. Thus, the air curtain 300 introduced by the air curtain module 132 can surround the wafer 200 arranged on the wafer table 131, and shield the wafer from contaminants from the wafer stage 110 and the frame structure 120. The contaminants can be, for example, copper debris separated from the frame structure 120 or the wafer stage 110. Without the air curtain 300, the copper debris and other contaminants can fall onto the wafer accommodated on the wafer table 131 of the wafer chuck 130, and compromise the entire wafer or a portion thereof.

In some embodiments of the present disclosure, the airflow is introduced by the airflow direction controller 180 of the air curtain module 132 in an airflow direction AD, and an angle θ included between the airflow direction and a vertical direction VD is constant. In other words, the direction of the airflow direction AD is constant. The angle θ included between the airflow direction AD and the vertical direction VD is from about zero degrees to about forty five degrees. The airflow direction is directed upward, and relative to the vertical direction is directed outward away from the opening 121 of the frame structure 120. By flowing away from the opening 121, the airflow pushes contaminants particles away from the opening 121 and away from the wafer accommodated on the wafer table 131 positioned under the opening 121.

In some embodiments of the present disclosure, the angle θ included between the airflow direction AD and the vertical direction VD is constant and is about zero degrees. In other words, the airflow direction AD is directed upward, and substantially parallel to the vertical direction VD.

In some embodiments of the present disclosure, the angle θ included between the airflow direction AD and the vertical direction VD is constant and is from about zero degrees to about forty five degrees. The airflow direction AD is directed upward, and relative to the vertical direction VD is directed inward toward the opening 121.

In some embodiments of the present disclosure, the airflow is introduced by the air curtain module 132 in an airflow direction AD, and an angle θ included between the airflow direction AD and a vertical direction VD is varying. In other words, the direction of the airflow direction AD is varying. Specifically, the angle θ included between the airflow direction AD and the vertical direction VD varies between about zero degrees to about forty five degrees, and relative to the vertical direction VD, the airflow direction AD varies between being directed away from the opening 121 and being directed toward the opening 121.

In some embodiments of the present disclosure, the gas introduced into the air curtain module 132 by the airflow pressure controller 170, and the airflow introduced by the air curtain module 132 can include hydrogen gas. The airflow pressure controller 170 can control the flow pressure of the airflow to be between about 1 KPa and about 50 KPa. When the flow pressure of the airflow is lower than 1 KPa, the airflow may not be strong enough to prevent contaminants from penetrating the air curtain 300 formed by the airflow. When the flow pressure of the airflow is greater than 50 KPa, the airflow may be too strong so as to damage portions of the frame structure 120, especially the sensors 151, 152.

Figure 7B:
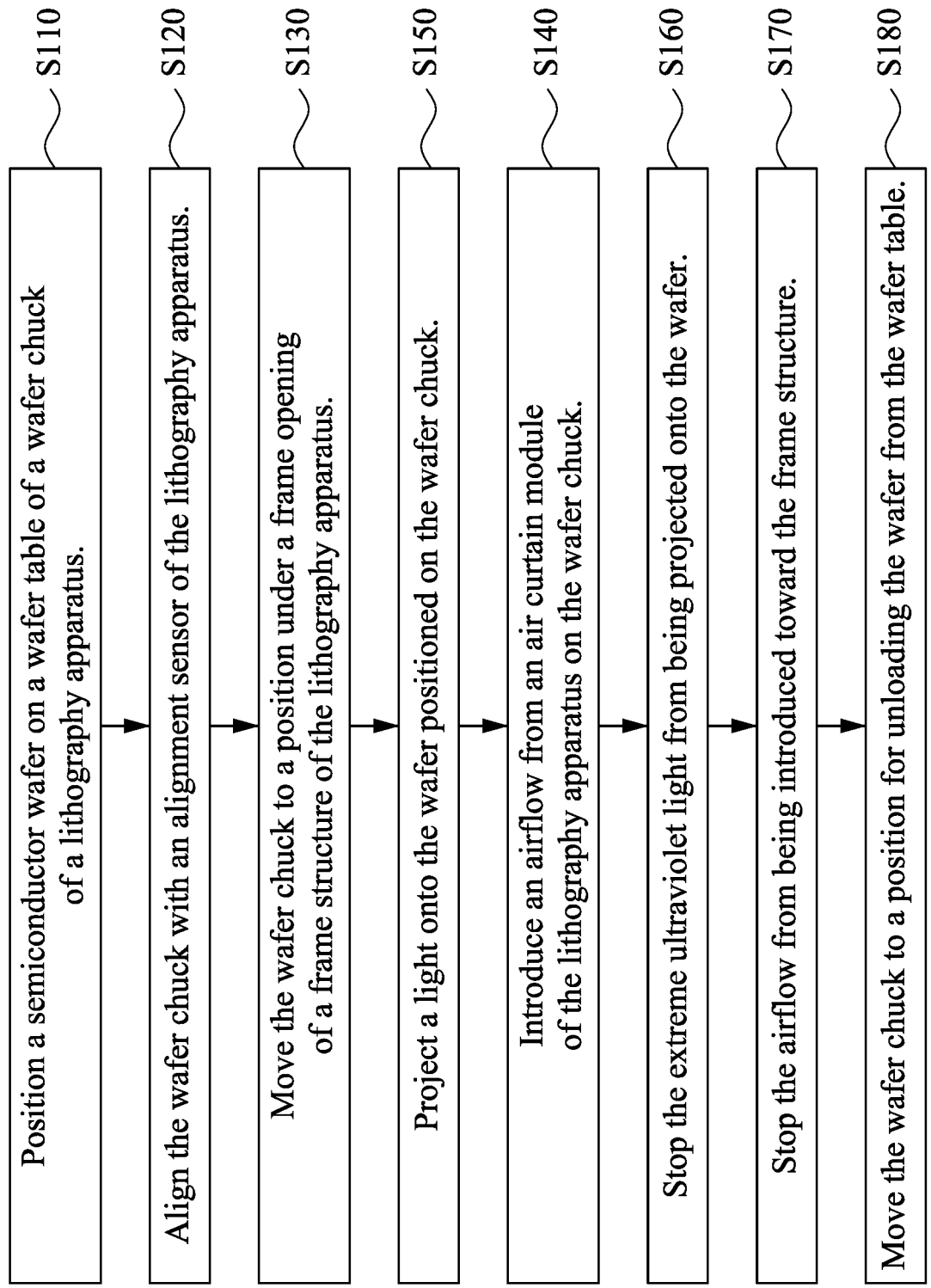
FIG. 7B shows a flowchart of a method for patterning a photoresist layer on a wafer by using a wafer lithography apparatus, according to some embodiments of the present disclosure.

In step S150, a light is projected onto the wafer positioned on the wafer chuck. Specifically, as shown in FIG. 1A, an extreme ultraviolet light is projected through the opening 121 of the frame structure 120, onto the wafer 200 at the first position P1. In some embodiments, the wavelength of the extreme ultraviolet is about 13.5 nm. The extreme ultraviolet projects a pattern image onto a photoresist layer on the wafer 200, and alters the exposed portions of the photoresist layer such that the photoresist layer can be selectively etched by an etching solution. In some embodiments, operation S150 is carried out after operation S140. In some embodiments, as shown in FIG. 7B, operation S150 is carried out prior to operation S140.

In operation S160 the light is stopped from being projected onto the wafer.

In operation S170, the airflow is stopped from being introduced toward the frame structure. The airflow pressure controller 170 stops feeding gas into the air curtain module 132, and thus the pressure inside the airflow passage 1322 is not sufficient to force an airflow out of the airflow opening 1321 toward the frame structure 120. In some embodiments, operation S170 is carried out after operation S160. In some embodiments, as shown in FIG. 7B, operation S170 is carried out prior to operation S160.

In operation S180, the wafer chuck is moved to a position for unloading the wafer from the wafer table, from where the wafer is removed from the wafer table. The photoresist layer on the wafer 200 is patterned, and ready for etching at another station such that desired portions of the photoresist layer is removed, and desired portions of the photoresist layer remains.

In some embodiments, the order between operation S140 and operation S150, and the order between operation S160 and operation S170, can be combined in different ways. For example, in some embodiments, operation S140 is carried out before operation S150, and operation S170 is carried out before operation S160. In some embodiments, operation S150 is carried out before operation S140, and operation S160 is carried out before operation S170.

Figure 8:
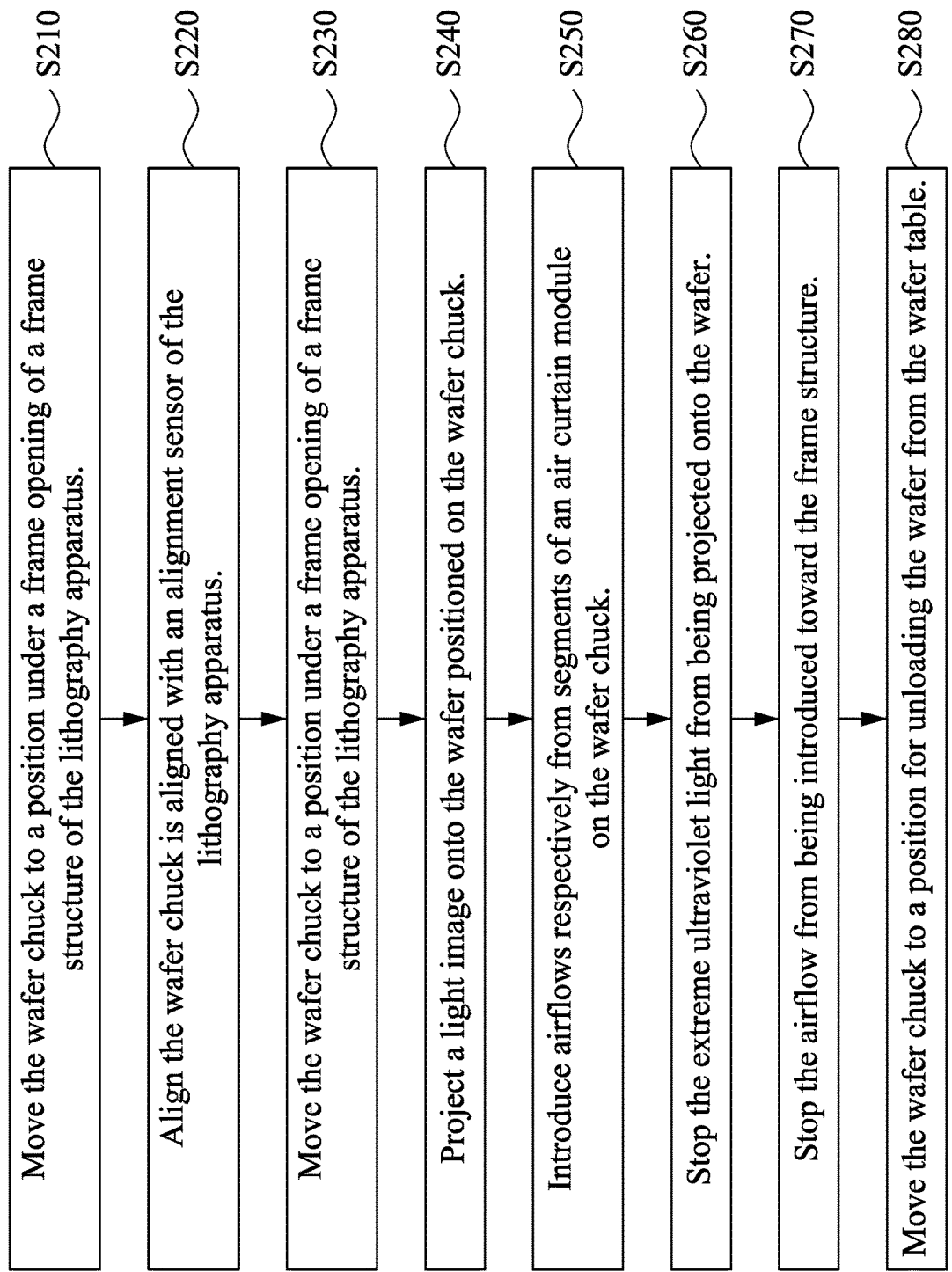
FIG. 8 shows a flowchart of a method for patterning a photoresist layer on a wafer by using a wafer lithography apparatus, according to some embodiments of the present disclosure.

FIG. 8 shows a flowchart of a method for patterning a photoresist layer on a wafer by using a wafer lithography apparatus, according to some embodiments of the present disclosure. The method is merely an example, and is not intended to limit the present disclosure beyond what is explicitly recited in the claims. Additional operations can be provided before, during, and after the method, and some operations described can be replaced, eliminated, or moved around for additional embodiments of the process.

In operation S210, a semiconductor wafer is positioned on a wafer table of a wafer chuck of a lithography apparatus. In operation S220, the wafer chuck is aligned with an alignment sensor of the lithography apparatus. In operation S230, the wafer chuck is moved to a position under an opening of a frame structure of the lithography apparatus. In operation S240, a light image is projected onto the wafer positioned on the wafer chuck. Specifically, an extreme ultraviolet light is projected through the opening of a frame structure. In operation S250, airflows are introduced respectively from segments of an air curtain module on the wafer chuck. Each of the airflows is directed from the air curtain module toward the frame structure, and the air curtain module surrounds the wafer. In operation S260 the light is stopped from being projected onto the wafer. In operation S270, the airflow is stopped from being introduced toward the frame structure. In operation S280, the wafer chuck is moved to a position for unloading the wafer from the wafer table.

The air curtain module 132 includes a plurality of segments 1320 separate from each other as shown in FIG. 5. In operation S250, each of the segments 1320 can introduce an air curtain 300 in the same airflow direction, or in different airflow directions. An included angle θ between the vertical direction and the airflow directions of each of the airflows introduced by the segments 1320 of the air curtain module 132 can be a constant angle θ between about zero degrees to about forty five degrees, a constant angle θ of about zero degrees, or a varying angle θ varying between about zero degrees to about forty five degrees.

The other operations are similar to those described above and not further detailed herein. Similar to the above method, in some embodiments, the order between operation S240 and operation S250, and the order between operation S260 and operation S270, can be combined in different ways. For example, in some embodiments, operation S240 is carried out before operation S250, and operation S270 is carried out before operation S260. In some embodiments, operation S250 is carried out before operation S240, and operation S260 is carried out before operation S270. In some embodiments, operation S250 is carried out before operation S240, and operation S270 is carried out before operation S260.

Figure 9:
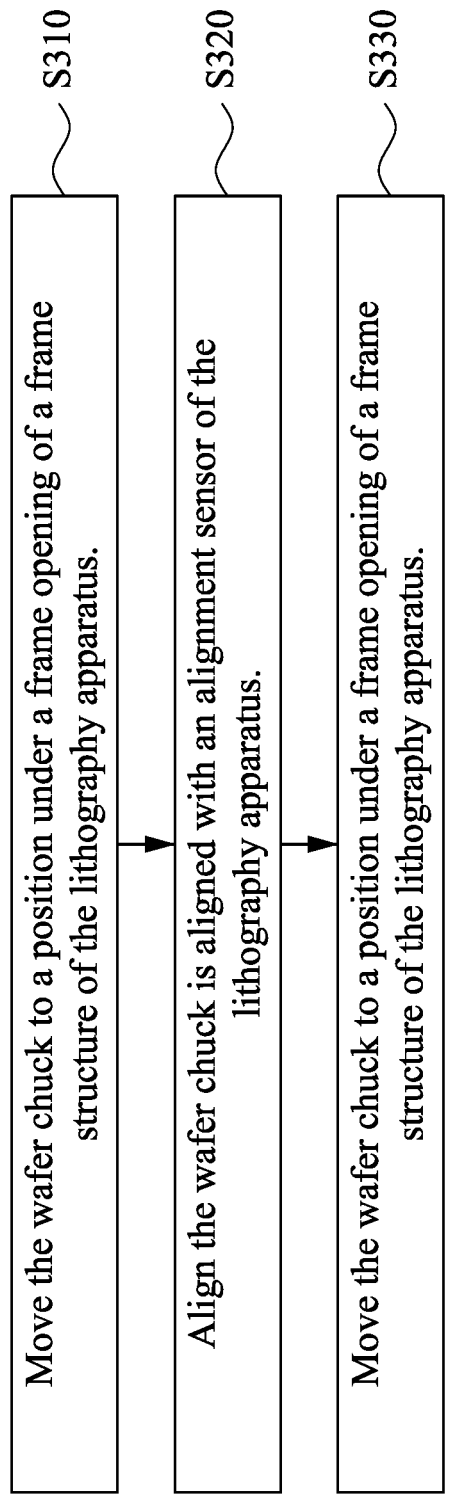
FIG. 9 shows a flowchart of a method for cleaning a wafer lithography apparatus by using the air curtain module arranged on the wafer chuck, according to some embodiments of the present disclosure.

When not conducting a lithography process, the airflow introduced by the air curtain module 132 can clean a bottom surface of the frame structure 120. FIG. 9 shows a flowchart of a method for cleaning a wafer lithography apparatus by using the air curtain module arranged on the wafer chuck, according to some embodiments of the present disclosure. The method is merely an example, and is not intended to limit the present disclosure beyond what is explicitly recited in the claims. Additional operations can be provided before, during, and after the method, and some operations described can be replaced, eliminated, or moved around for additional embodiments of the process.

In operation S310, a dummy wafer is placed on a wafer table of a wafer chuck of a lithography apparatus. For example, as shown in FIG. 3, the dummy wafer may be made of a silicone material, or the like. The dummy wafer positioned on the wafer table 131 prevents contaminants from falling on the wafer table 131, thereby keeping the wafer table 131 clean.

In operation S320, an airflow is introduced from the wafer chuck toward a frame structure of the lithography apparatus, by using an air curtain module having a ring shape. As shown in FIG. 1B, the air curtain module 132 is part of the wafer chuck 130. The airflow introduced from the air curtain module 132 of the wafer chuck 130 forms an air curtain 300. The air curtain module 132 of the wafer chuck 130 surrounds the wafer table 131, and the airflow flows in an upward direction toward the frame structure 120. In some embodiments of the present disclosure, the air curtain module 132 has four sides. The frame structure 120 surrounds a portion of a projection optical system 140, and the top opening 301 of the air curtain 300 does not surround the opening 121 of the frame structure 120.

In some embodiments of the present disclosure, the airflow is introduced by the air curtain module 132 in an airflow direction AD, and an angle θ included between the airflow direction and a vertical direction VD is constant. In other words, the direction of the airflow direction AD is constant. The angle θ included between the airflow direction AD and the vertical direction VD is from about zero degrees to about forty five degrees.

In some embodiments of the present disclosure, the angle θ included between the airflow direction AD and the vertical direction VD is constant and is about zero degrees. In other words, the airflow direction AD is directed upward, and substantially parallel to the vertical direction VD.

In some embodiments of the present disclosure, the angle θ included between the airflow direction AD and the vertical direction VD is constant and is from about zero degrees to about forty five degrees. The airflow direction AD is directed upward, and relative to the vertical direction VD is directed inward toward the opening 121.

In some embodiments of the present disclosure, the airflow is introduced by the air curtain module 132 in an airflow direction AD, and an angle θ included between the airflow direction AD and a vertical direction VD is varying. In other words, the direction of the airflow direction AD is varying.

In some embodiments of the present disclosure, the gas introduced into the air curtain module 132 by the airflow pressure controller 170, and the airflow introduced by the air curtain module 132 can include clean dry air, nitrogen gas, or the like. The airflow pressure controller 170 can control the flow pressure of the airflow to be between about 1 KPa and about 50 KPa. When the flow pressure of the airflow is lower than 1 KPa, the airflow may not be strong enough to remove contaminants from the frame structure 120. When the flow pressure of the airflow is greater than 50 KPa, the airflow may be too strong so as to damage portions of the frame structure 120, especially the sensors 151, 152.

In operation S330, the wafer chuck is moved in a horizontal direction, such that the airflow impacts different portions of the frame structure. As shown in FIG. 3, the wafer chuck 130 is movably coupled to the wafer stage 110, and is moved on the top face 111 of a wafer stage 110 by adjusting the magnetic field of an electromagnet in the wafer chuck. In some other embodiments, the wafer chuck 130 is moved on the top face 111 of the wafer stage 110 by adjusting the magnetic field of an electromagnet in the wafer stage 110.

Specifically, in some embodiments of the present disclosure, the magnet in the wafer chuck 130 and a magnet in the wafer stage 110 are each an electromagnet. The magnetic field of each electromagnet can be adjusted by an electric current, through an electric wire connected to the corresponding electromagnet. In some embodiments, an electromagnet controller 160 is configured to control the electric field of the electromagnet of the wafer chuck 130, and/or the electric field of the electromagnet of the wafer stage 110. By controlling the electric field of the electromagnet in the wafer chuck 130, and/or the electric field of the electromagnet in the wafer stage 110, the wafer chuck 130 can be controlled to move on the top face 111 of the wafer stage 110 in a horizontal direction.

Alternately, in some embodiments of the present disclosure, the magnet in the wafer chuck 130 is an electromagnet, and the magnet in the wafer stage 110 is a permanent magnet. The magnetic field of the electromagnet of the wafer chuck 130 can be adjusted by an electric current, through an electric wire connected thereto. By controlling the electric field of the electromagnet in the wafer chuck 130, the wafer chuck 130 can be controlled to move on the top face 111 of the wafer stage 110 in a horizontal direction.

As the wafer chuck 130 is moved under the frame structure 120, the airflow directed toward the frame structure 120 can impact different parts of the bottom surface 122 of the frame structure 120, or sensors 151, 152 located at the bottom surface 122 of the frame structure 120. Contaminants at the sensor 151, 152 or the bottom surface 122 of the frame structure 120 impacted by the airflow are removed. The contaminants can be, for example, copper debris from the frame structure 120.

By using an air curtain module to introduce an airflow in an upward direction, an air curtain is created surrounding a wafer table of a wafer chuck. The air curtain protects wafer on the wafer table from contaminants during lithography. Moreover, the air curtain can be used to clean a frame structure over the wafer chuck during maintenance.

According to some embodiments of the present disclosure, a method comprises loading a wafer onto a wafer chuck of a lithography apparatus, projecting an extreme ultraviolet light through an opening of a frame structure of the lithography apparatus onto the wafer, and introducing an airflow from an air curtain module on the wafer chuck toward the frame structure, wherein the air curtain module surrounds the wafer.

According to some embodiments of the present disclosure, a method comprises introducing an airflow from a wafer chuck of a lithography apparatus toward a frame structure of the lithography apparatus by using an air curtain module having a ring shape, wherein the frame structure surrounds a portion of a projection optical system of the lithography apparatus, and moving the wafer chuck in a horizontal direction such that the airflow impacts different portions of the frame structure.

According to some embodiments of the present disclosure, a lithography apparatus comprises a light source, a wafer stage, a projection optical system above the wafer stage and connected to the light source, a frame structure above the wafer stage and having an opening therein, and a wafer chuck having a wafer table and an air curtain module. The opening is configured to accommodate a projection optical system. The wafer chuck is disposed between the wafer stage and the frame structure and is movably coupled to the wafer stage. The wafer table faces the frame structure. The air curtain module surrounds the wafer table. The air curtain module is configured to introduce an airflow toward the frame structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   loading a wafer onto a wafer chuck of a lithography apparatus;
   aligning the wafer chuck to an alignment sensor of the lithography apparatus, wherein the alignment sensor is on a frame structure of the lithography apparatus;
   moving the wafer chuck to a position under an opening of the frame structure;
   projecting an extreme ultraviolet light through the opening of the frame structure of the lithography apparatus, onto the wafer; and
   after aligning the wafer chuck to the alignment sensor, starting an introduction of an airflow from an air curtain module on the wafer chuck toward the frame structure, wherein the air curtain module surrounds the wafer.

2. The method according to claim 1, wherein introducing the airflow is performed prior to projecting the extreme ultraviolet light.

3. The method according to claim 1, wherein projecting the extreme ultraviolet light is performed prior to introducing the airflow.

4. The method according to claim 1, wherein the airflow comprises hydrogen air.

5. The method according to claim 1, wherein introducing the airflow is such that the airflow is introduced in an airflow direction, and an angle included between the airflow direction and a vertical direction is constant.

6. The method according to claim 1, wherein introducing the airflow is such that the airflow is introduced in an airflow direction, and an angle included between the airflow direction and a vertical direction is varying.

7. The method according to claim 1, further comprising: stopping projecting the extreme ultraviolet light onto the wafer; and stopping introducing the air flow toward the frame structure after stopping projecting the extreme ultraviolet light onto the wafer.

8. The method according to claim 1, further comprising: stopping projecting the extreme ultraviolet light onto the wafer; and stopping introducing the air flow toward the frame structure prior to stopping projecting the extreme ultraviolet light onto the wafer.

9. The method according to claim 1, wherein the airflow is introduced at a pressure from about 1 KPa to about 50 KPa.

10. The method of claim 1, wherein the alignment sensor is on a bottom surface of the frame structure.

11. A method, comprising:
    aligning a wafer chuck to an alignment sensor of a lithography apparatus;
    after aligning the wafer chuck to the alignment sensor of the lithography apparatus, starting an introduction of an airflow from the wafer chuck of the lithography apparatus toward a frame structure of the lithography apparatus by using an air curtain module having a ring shape, wherein the frame structure surrounds a portion of a projection optical system of the lithography apparatus; and
    moving the wafer chuck in a horizontal direction such that the air curtain module faces a sensor on a bottom surface of the frame, and the airflow flows toward the sensor.

12. The method according to claim 11, wherein the airflow comprises clean dry air or nitrogen gas.

13. The method according to claim 11, further comprising placing a dummy wafer on a wafer table of the wafer chuck, prior to introducing the airflow from the wafer chuck toward the frame structure.

14. The method according to claim 11, further comprising adjusting a pressure of the airflow.

15. The method according to claim 11, further comprising adjusting an airflow direction of the airflow.

16. A lithography apparatus, comprising:
    a light source;
    a wafer stage;
    a projection optical system above the wafer stage and connected to the light source;
    a frame structure above the wafer stage and having an opening therein, and an alignment sensor arranged on a bottom surface of the frame structure, wherein the opening is configured to accommodate a portion of the projection optical system;
    a wafer chuck comprising a wafer table, and an air curtain module, wherein the wafer chuck is disposed between the wafer stage and the frame structure, and is movably coupled to the wafer stage, the wafer table faces the frame structure, the air curtain module surrounds the wafer table, and wherein from a top view, the air curtain module has a continuous rectangular-ring shape having an inner length greater than a diameter of the wafer table, the air curtain module is configured to start an introduction of an airflow toward the frame structure after aligning the wafer chuck to the alignment sensor of the lithography apparatus, and the air curtain module is below the alignment sensor; and a controller configured to control the air curtain module to start the introduction of the airflow toward the frame structure after aligning the wafer chuck to the alignment sensor of the lithography apparatus.

17. The apparatus according to claim 16, wherein the air curtain module has four sides, and a distance between any two opposite sides is greater than a width of the opening of the frame.

18. The apparatus according to claim 16, wherein the air curtain module comprises:

an airflow passage surrounding the wafer table; and a gas source connected to the airflow passage.

19. The apparatus according to claim 18, wherein the air curtain module further comprises:

a direction panel connected to the airflow passage and configured to determine an airflow direction of the airflow.

20. The apparatus according to claim 16, further comprising a level sensor arranged on the bottom surface of the frame structure, wherein the level sensor and the alignment sensor are on the same side of the portion of the projection optical system.

* * * * *